United States Patent
Upputuri et al.

(10) Patent No.: US 9,322,859 B2
(45) Date of Patent: Apr. 26, 2016

(54) OFFSET COMPENSATION FOR SENSE AMPLIFIERS

(71) Applicant: TAIWAN SEMICONDUCTOR MANUFACTURING COMPANY, LTD., Hsinchu (TW)

(72) Inventors: Bharath Upputuri, Santa Clara, CA (US); Shreekanth Sampigethaya, San Jose, CA (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 372 days.

(21) Appl. No.: 13/728,637

(22) Filed: Dec. 27, 2012

(65) Prior Publication Data
US 2013/0113552 A1   May 9, 2013

Related U.S. Application Data

(62) Division of application No. 12/903,652, filed on Oct. 13, 2010, now Pat. No. 8,362,807.

(51) Int. Cl.
*G11C 29/02* (2006.01)
*G01R 27/02* (2006.01)
*G11C 7/06* (2006.01)

(52) U.S. Cl.
CPC ............... *G01R 27/02* (2013.01); *G11C 7/065* (2013.01); *G11C 29/02* (2013.01); *G11C 29/026* (2013.01); *G11C 29/028* (2013.01)

(58) Field of Classification Search
USPC .......................................................... 327/52
See application file for complete search history.

(56) References Cited

U.S. PATENT DOCUMENTS

| | | | |
|---|---|---|---|
| 5,053,996 A * | 10/1991 | Slemmer | 365/156 |
| 5,424,985 A * | 6/1995 | McClure et al. | 365/194 |
| 6,181,621 B1 | 1/2001 | Lovett | |
| 7,020,035 B1 | 3/2006 | Eleyan et al. | |
| 7,164,612 B1 | 1/2007 | Eleyan et al. | |
| 7,639,556 B2 * | 12/2009 | Yang et al. | 365/207 |

(Continued)

FOREIGN PATENT DOCUMENTS

| CN | 101667452 | 3/2010 |
|---|---|---|
| EP | 1 104 092 | 5/2001 |
| TW | 200926170 | 6/2009 |

OTHER PUBLICATIONS

Office Action dated Jul. 30, 2013 from corresponding application No. EP 13169111.5-1806.

(Continued)

*Primary Examiner* — Ryan Jager
(74) *Attorney, Agent, or Firm* — Hauptman Ham, LLP

(57) ABSTRACT

A method of re-offsetting a plurality of amplifier is provided. The method includes testing the plurality of amplifiers based on a re-offset value at bulks of compensation transistors of the plurality of amplifiers; identifying a first group of first amplifiers of the plurality of amplifiers favoring reading a first logic level and/or a second group of second amplifiers of the plurality of amplifiers favoring reading a second logic level different from the first logic level, based on results of the testing step; changing the re-offset value to a new re-offset value; re-offsetting the first group of first amplifiers and/or the second group of second amplifiers based on the new re-offset value; and re-testing the first group of first amplifiers and the second group of second amplifiers.

20 Claims, 5 Drawing Sheets

(56) References Cited

U.S. PATENT DOCUMENTS

| | | |
|---|---|---|
| 2002/0024851 A1 | 2/2002 | Kawasumi |
| 2004/0136253 A1 | 7/2004 | Gupta et al. |
| 2006/0232303 A1* | 10/2006 | Li et al. .......................... 327/51 |
| 2007/0081389 A1* | 4/2007 | Tran et al. ................. 365/185.21 |
| 2007/0205807 A1* | 9/2007 | Tsuchi et al. ................... 327/51 |
| 2008/0181024 A1* | 7/2008 | Kim ........................ 365/189.06 |
| 2010/0067318 A1 | 3/2010 | Senou |
| 2010/0090725 A1* | 4/2010 | Imai et al. ....................... 327/52 |
| 2015/0069997 A1* | 3/2015 | Kawahata et al. ............. 324/105 |

OTHER PUBLICATIONS

Office Action dated Jun. 24, 2014 from corresponding No. TW 100110967.

* cited by examiner

US 9,322,859 B2

OFFSET COMPENSATION FOR SENSE AMPLIFIERS

CROSS-REFERENCE TO RELATED APPLICATIONS

The present application is a Divisional of U.S. application Ser. No. 12/903,652, filed on Oct. 13, 2010, which is incorporated by reference herein in its entirety.

TECHNICAL FIELD

The present disclosure is generally related to sense amplifiers, and, more particularly, to offset compensation for sense amplifiers.

BACKGROUND

A sense amplifier (SA) is used to sense the difference between two signals at two inputs of the sense amplifier, and amplify the difference or, commonly stated, amplify the differential signal across the inputs. To sense correctly, a sense margin, which is the minimum difference between the two signals, or the minimum differential signal, is required.

In many situations, process variation causes two different threshold voltages to be present in two transistors that are supposed to be the same (e.g., two NMOS transistors of a cross latch of an amplifier). In that situation, the sense amplifier is said to have an offset at the two inputs caused by the mismatch of the two transistors. As a result, the sense amplifier favors reading one logic state versus another logic state, instead of neutrally providing the sensed data. For example, some sense amplifiers, when sensing the differential signal across two inputs, tend to favor a high logic level, (e.g., a High) while some other sense amplifiers tend to favor a low logic level (e.g., a Low). A sense amplifier tending to favor a High quickly provides the High as the read data at the output when the actual High data is sensed, but slowly provides a Low as the read data at the output when the actual Low data is sensed. Similarly, a sense amplifier tending to favor a Low quickly provides the Low when the actual Low data is sensed, but slowly provides a High when the actual High data is sensed.

In effect, because of the process variation, the mismatch manifests as an additional offset, which causes the sense amplifier to require a larger sense margin to correctly sense the data. In applications where one sense margin is used for many amplifiers, a larger value for the sense margin is utilized so that a very high percentage, or all, of the sense amplifiers function correctly. As the large sense margin is used, the time required for the differential signal to develop increases, making the overall memory access speed slower.

BRIEF DESCRIPTION OF THE DRAWINGS

The details of one or more embodiments of the disclosure are set forth in the accompanying drawings and the detailed description below. Other features and advantages will be apparent from the detailed description, drawings, and claims.

Like reference symbols in the various drawings indicate like elements.

DETAILED DESCRIPTION

Figure 1:
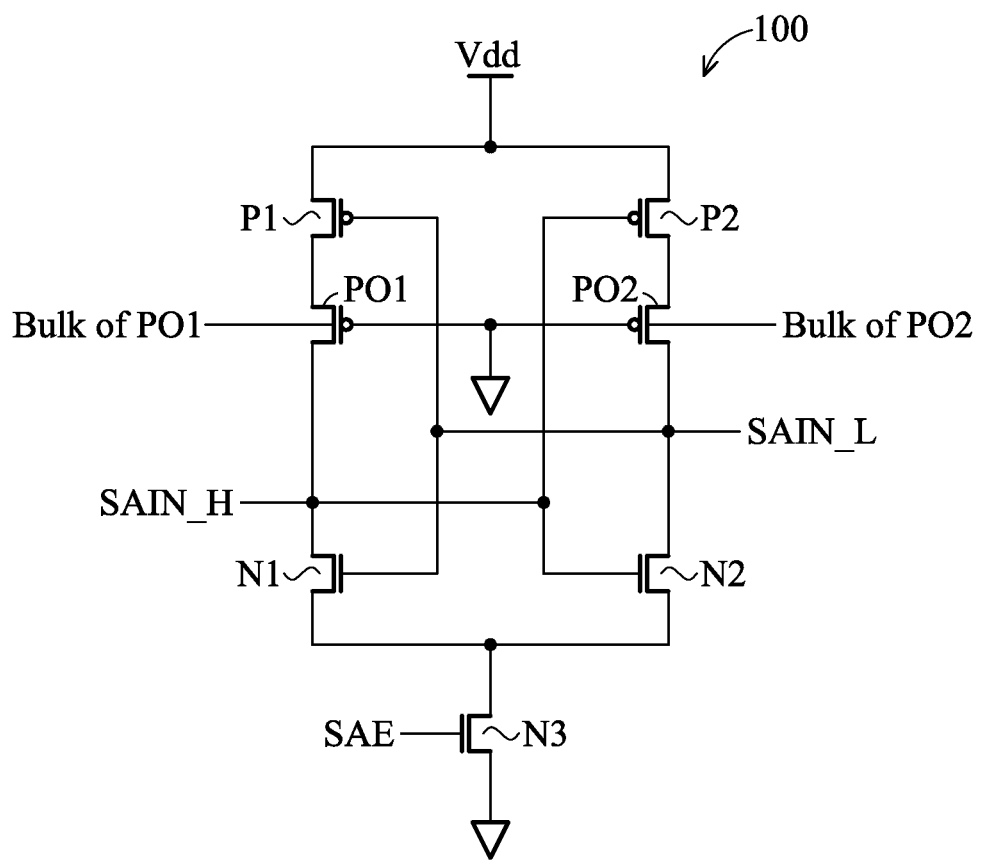
FIG. 1 is a diagram of a sense amplifier having compensation circuitry, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art. Reference numbers may be repeated throughout the embodiments, but they do not require that feature(s) of one embodiment apply to another embodiment, even if they share the same reference number.

Some embodiments can have one or a combination of the following features and/or advantages. The re-offset voltage provided to the bulks of the compensation transistors reduces the sense margin. As a result, the memory access time is improved.

Exemplary Sense Amplifiers with Compensation Mechanisms

FIG. 1 is a diagram of a sense amplifier (SA) 100, in accordance with some embodiments. In some embodiments, sense amplifier 100 is used in memory arrays, but SA 100 can be used in other circuits where a small signal difference is to be amplified, including, for example, an IO interface. In some memory applications, multiple memory cells on a column share the same amplifier.

SA 100 senses a high logic level (e.g., a High) at output Out when the voltage value at input SAIN_H is greater than the voltage value at input SAIN_L. Similarly, SA 100 senses a low logic level (e.g., a Low) at output Out when the voltage value at input SAIN_H is lower than the voltage value at input SAIN_L. Transistor N3 operates as a switch and serves as a current path for SA to be turned on/off. For example, when signal SAE is applied with a High, transistor N3 turns on, and provides a current path for SA 100 to turn on. In contrast, when signal SA is applied with a Low, transistor N3 turns off, and SA 100 turns off because there is no current path.

In some embodiments, for various reasons, including device manufacturing process variations, transistor N1 and transistor N2 are not exactly the same (i.e., mismatched). As a result, transistor N1 has a threshold voltage (e.g., threshold voltage Vthn1) different from that of transistor N2 (e.g., threshold voltage Vthn2), which causes an offset at inputs SAIN_H and SAIN_L. Because of the mismatch in the transistors, or the offset, at inputs SAIN_H and SAIN_L, sense amplifier 100 favors reading a logic state versus another logic state, instead of neutrally providing the sensed data. For example, if voltage Vthn1 is greater than voltage Vthn2, then SA 100 favors reading a Low on node SAIN_H when node SAIN_H serves as an output. If voltage Vthn1 is less than voltage Vthn2, then SA 100 favors reading a High on node SAIN_H when node SAIN_H serves as an output. For illustration, voltage ΔVth represents the difference between threshold voltage Vthn1 and threshold voltage Vthn2. Voltage ΔVth is positive if voltage Vthn1 is greater than voltage Vthn2, and voltage ΔVth is negative if voltage Vthn1 is less than voltage Vthn2. Further, voltage ΔInput represents the offset at inputs SAIN_H and SAIN_L corresponding to voltage ΔVth. In some embodiments, mechanisms are provided to compensate (e.g., reduce, cancel, re-offset, etc.) the effect of the threshold voltage offset (e.g., the voltage difference) ΔVth, and after the threshold offset ΔVth is re-offset, the input voltage offset caused by the threshold offset is reduced or canceled (e.g., re-offset). For simplicity of illustration, reducing or re-offsetting the offset described in this document could cancel the offset altogether.

PMOS transistors PO1 and PO2 are commonly called compensation transistors, and serve to re-offset (e.g., cancel, reduce, compensate, etc.) the offset caused by the mismatch between transistors N1 and N2. When compensation is desired, one or a combination of the bulk of transistor PO1 and PO2 is provided with one or a combination of bulk re-offset voltages (e.g., Vrob, Vrob1, Vrob2 illustrated below) that compensates for the mismatch. Alternatively stated, the bulk re-offset voltage(s) cancels the input offset at the corresponding input SAIN_H and/or SAIN_L. In some embodiments, the gates of transistors PO1 and PO2 are coupled together and to ground (e.g., Low) so that transistors PO1 and PO2 are turned on for re-offsetting. In the following explanation, for ease of discussion, when one re-offset voltage is provided to the bulk of one PMOS transistor (e.g., transistor PO2), the bulk of the other PMOS transistor (e.g., transistor PO1) remains the same (e.g., at voltage Vdd).

In some embodiments, if voltage Vthn1 is greater than voltage Vthn2 (e.g., voltage ΔVth is positive, and sense amplifier 100 favors reading a Low), a negative bulk re-offset voltage Vrob is provided to the bulk of transistor PO2, which cancels the offset at inputs SAIN_L and SAIN_H that corresponds to the threshold voltage difference ΔVth. But if voltage Vthn1 is less than voltage Vthn2 (e.g., voltage ΔVth is negative, and sense amplifier 100 favors reading a Low), a negative bulk re-offset voltage Vrob is provided to the bulk of transistor PO1, which also cancels the offset at inputs SAIN_L and SAIN_H corresponding to the threshold voltage difference ΔVth. Once voltage Vrob is provided to the bulk of transistor PO2 or transistor PO1, the threshold voltage of the corresponding transistor (e.g., voltage Vthp2 or voltage Vthp1) changes, which re-offsets the offset caused by the mismatch (e.g., the difference in the threshold voltages) between transistors N1 and N2.

In some embodiments, the mismatch between transistors N1 and N2 causing the offset exists after sense amplifier 100 is manufactured, and the difference in the threshold voltage ΔVth is identified by a Monte Carlos simulation. Based on the identified ΔVth, the re-offset voltage Vrob is determined and provided to the bulk of the corresponding transistor PO1 or PO2.

In some embodiments, a plurality of sense amplifiers (e.g., sense amplifiers 100) is used in a circuit (e.g., in a memory array), and the minimum sense margin (e.g., Smin) for the plurality of sense amplifiers is known. For example, the minimum sense margin Smin is the mean of the sense margins of all sense amplifiers plus three sigma. The sense amplifiers are then configured to sense some known data based on the known (i.e., pre-determined) sense margin. In some embodiments related to a memory array, a built-in self test (BIST) is used to test the sense amplifiers used in the memory array. For example, for each sense amplifier the minimum read margin is set for the sense amplifier, the BIST is invoked for the sense amplifier to test itself using a specific input data (e.g., a Low or a High). The test result is compared against the expected test data from which the sense amplifiers are classified into a group of sense amplifiers favoring reading a High (e.g., group I) and/or another group of sense amplifiers favoring reading a Low (e.g., group II).

For example, sense amplifiers that are supposed to provide a Low after sensing, but provide the failed data, reveal that the sense amplifiers favor reading a High and thus are classified into group I. Similarly, sense amplifiers that are supposed to provide a High after sensing but failed the sensing reveal that those amplifiers favor reading a Low and are classified into group II. For each sense amplifier in group I, a corresponding positive bulk re-offset voltage Vrob is provided to the bulk of transistor PO2, which, in effect, provides the input re-offset to input SAIN_L. At the same time, the bulk of each transistor PO2 in group I remains unchanged, e.g., at voltage Vdd. Similarly, for each sense amplifier in group II, a corresponding bulk re-offset voltage Vrob is provided to the bulk of transistor PO1, which, in effect, provides the input re-offset to input SAIN_H. At the same time, the bulk of each transistor PO1 in group II remains unchanged, e.g., at voltage Vdd.

In some embodiments, re-offset voltage Vrob is calculated based on the difference in the threshold voltage of transistor N1 (e.g., Vthn1) and that of transistor N2 (e.g., Vthn2), e.g., voltage ΔVt. If voltage ΔVt is 0, then the offset is 0, and re-offset voltage Vrob is 0 V. But if voltage ΔVt is not 0, voltage ΔVt is used to generate the difference in threshold voltages of transistors PO1 and PO2 (e.g., ΔVtp) to re-offset the voltage difference ΔVt of transistors N1 and N2, by, for example, changing one or a combination of the threshold voltage of transistors PO1 and PO2. For example, if ΔVt is 100 mV, then the threshold voltage of transistor PO1 (e.g., voltage Vthpo1) is configured to change by 100 mV, while the threshold voltage of transistor PO2 (e.g., voltage Vthpo2) remains unchanged, or voltage Vthpo2 of transistor PO2 is configured to change by −100 mV while voltage Vthpo1 of transistor PO1 remains unchanged. Alternatively, voltage Vthpo1 is configured to change by 40 mV, 50 mV, or 60 mV, and voltage Vthpo2 is configured to change by −60 mV, −50 mV, and −40 mV, etc., respectively. For illustration, the threshold voltage of transistors PO2 is adjusted. In other words, threshold voltage Vthpo2 is changed by −ΔVtp where ΔVtp=ΔVt. In some embodiments, ΔVtp is generated by providing negative voltage Vrob to the bulk of transistor PO2. Further, voltage Vrob is calculated based on the equation:

$$V_{TN} = V_{TO} + \gamma(\sqrt{V_{SB}+2\phi_F} - \sqrt{2\phi_F})$$

where $V_{TN}$ is the threshold voltage of transistor PO2 when the substrate bias is present, $V_{SB}$ is the source-to-body substrate bias (e.g., Vrob), $2\phi_F$ is the surface potential, and $V_{TO}$ is the threshold voltage for zero substrate bias and γ is the body effect parameter.

FIG. 1 is illustrated with the transistor PO1 coupled between transistors P1 and N1, and transistor PO2 coupled between transistors P2 and N2. Various embodiments are not so limited. Transistor PO1 can be coupled between voltage Vdd and transistor P1 while transistor PO2 can be coupled between voltage Vdd and transistor P2. The sign of re-offset voltage Vrob, however, is changed accordingly, as recognizable by persons of ordinary skilled in the art. For example, when voltage Vthn1 is greater than voltage Vthn2 (e.g., voltage ΔVth is positive), a corresponding positive re-offset voltage Vrob is applied at the bulk of transistor PO2, and when voltage Vthn2 is less than voltage Vthn2 (e.g., voltage ΔVth is negative), a corresponding positive re-offset voltage Vrob is applied at the bulk of transistor PO1, etc.

Exemplary Offset Circuits

Figure 2:
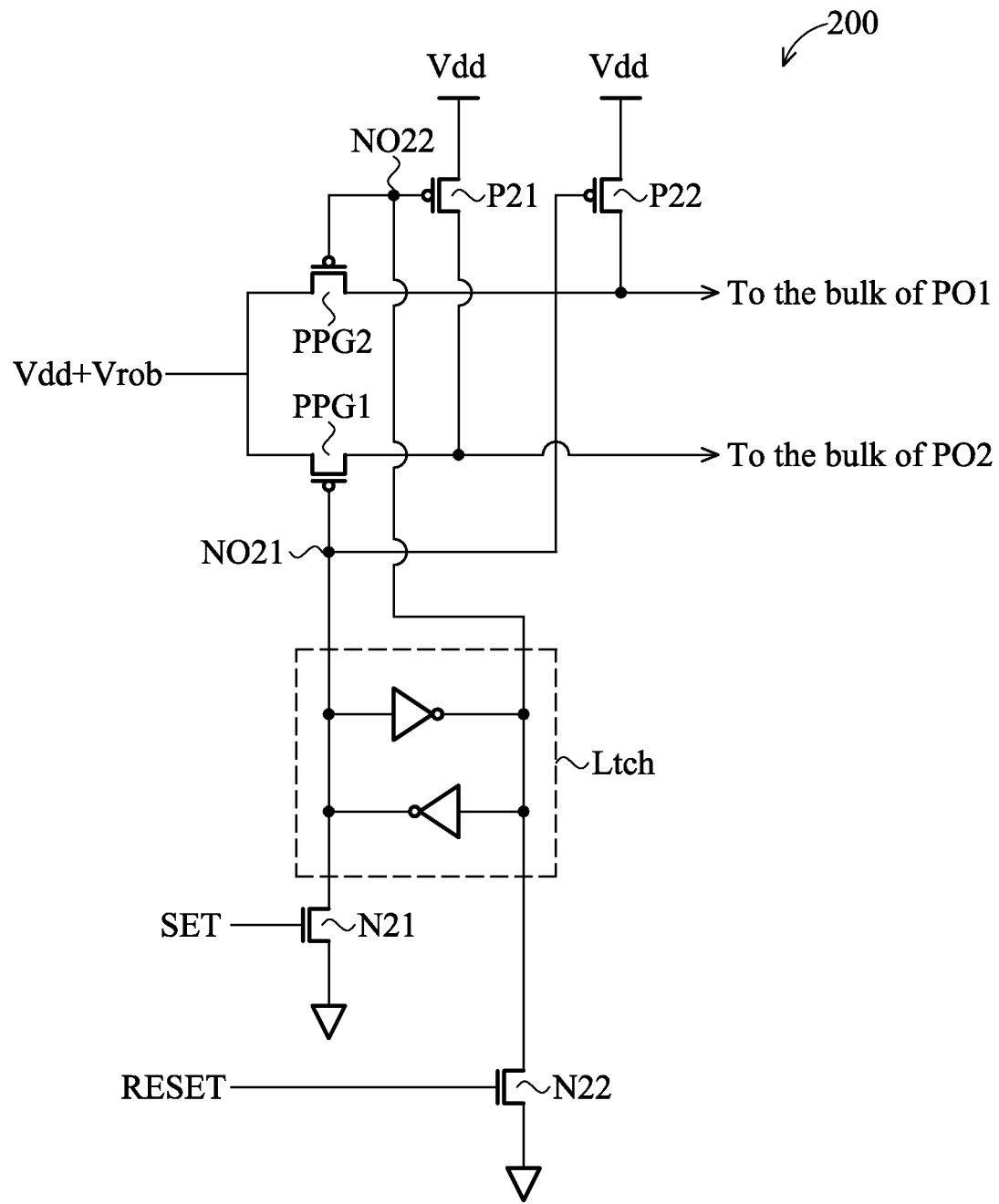
FIG. 2 is a diagram of a circuit illustrating a first mechanism to compensate for the offset of the sense amplifier in FIG. 1, in accordance with some embodiments.

FIG. 2 is a diagram of a circuit 200 illustrating offset compensation for SA 100, in accordance with some embodiments. In this illustration, the bulk of one transistor (e.g., transistor PO1 or PO2) remains the same (e.g., at voltage Vdd) while the bulk of the other transistor is provided with bulk re-offset voltage Vrob. In some embodiments, the bulk of PMOS transistors without a re-offset is set at voltage Vdd, and the bulk of the transistor receiving the offset is provided with voltage Vdd+Vrob to provide the re-offset voltage Vrob. For example, if the re-offset is for transistor PO2, then the bulk of transistor PO2 is provided with Vdd+Vrob, while the bulk of transistor PO1 remains the same at voltage Vdd. Similarly, if the re-offset is to transistor PO1, then the bulk of transistor PO1 is provided with Vdd+Vrob, while the bulk of transistor PO2 remains the same at voltage Vdd. In some embodiments, re-offsetting to the bulk of transistor PO2 with a re-offset voltage value Vrob results in a re-offset at input SAIN_L with a corresponding voltage value Vroi. Similarly, re-offsetting to the bulk of transistor PO1 with a re-offset voltage value results in a re-offset at input SAIN_H with a corresponding voltage value Vroi.

In FIG. 2, when signal SET is activated (e.g., applied with a High), NMOS transistor N21 turns on, which pulls node NO21, which is the drain of transistor N21, to ground (e.g., Low). As a result, transistor PPG1 is turned on, and voltage Vdd+Vrob is passed through transistor PPG1 to the bulk of transistor PO2. In effect, the bulk of transistor PO2 is provided with a re-offset voltage value of Vrob. Node NO21 pulled low also causes transistor P22 to turn on, which transfers voltage Vdd at the source of transistor P22 to the drain of transistor P22 or to the bulk of transistor PO1.

Similarly, when signal RESET is activated (e.g., applied with a High), NMOS transistor N22 turns on, which pulls node NO22, which is the drain of transistor N22, to ground (e.g., Low). As a result, transistor PPG2 is turned on, and voltage Vdd+Vrob is passed through transistor PPG2 to the bulk of transistor PO1. In effect, the bulk of transistor PO1 is provided with a re-offset voltage value of Vrob. Node NO22 being Low also causes transistor P21 to turn on, which transfers voltage Vdd at the source of transistor P21 to the drain of transistor P21 or to the bulk of transistor PO2.

Latch Ltch stores the value passed through transistors PPG1 and PPG2 at nodes NO21 and NO22, respectively.

Figure 3:
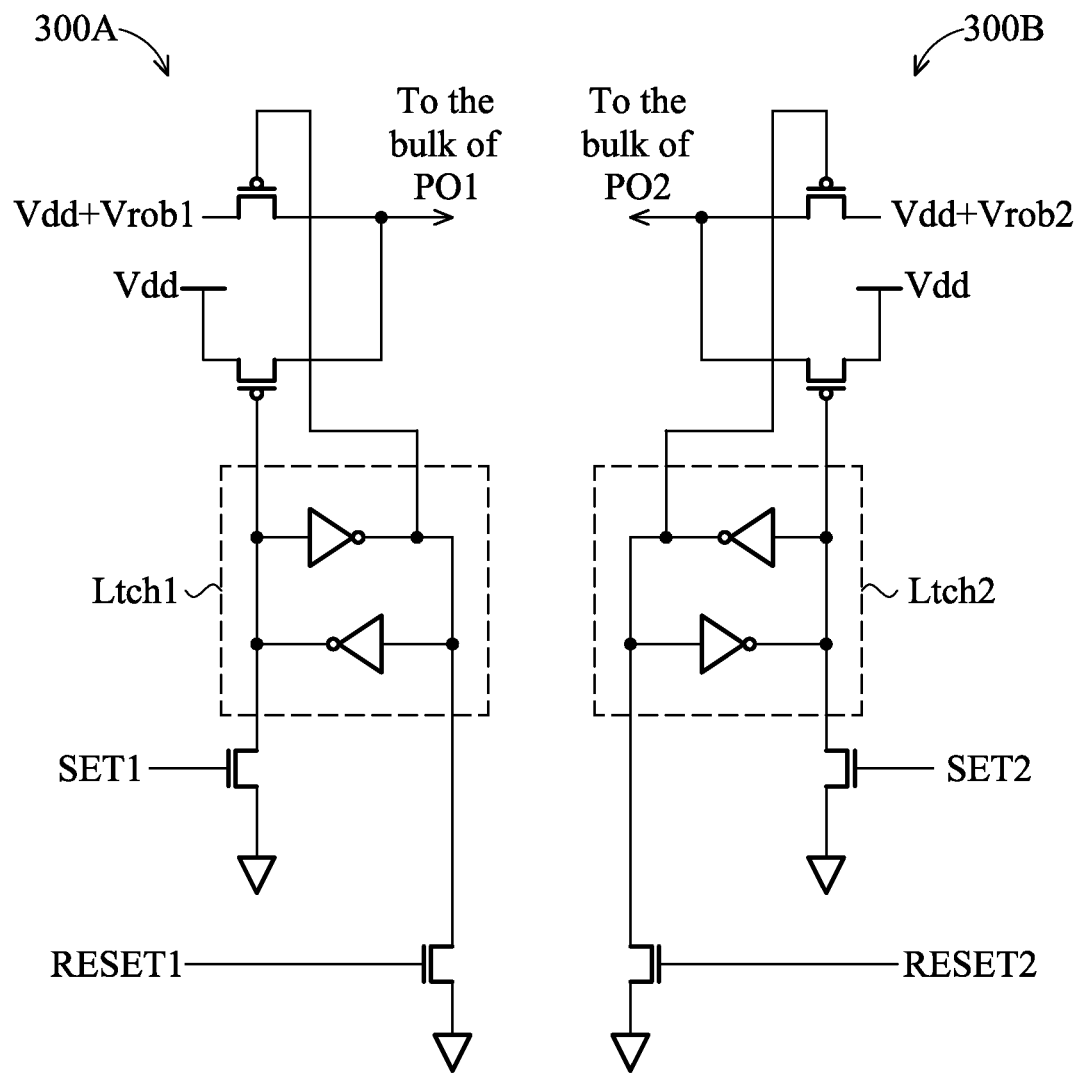
FIG. 3 is a diagram of a circuit illustrating a second mechanism to compensate for the offset of the sense amplifier in FIG. 1, in accordance with some embodiments.

In the above illustration, the bulk of one transistor (e.g., transistor PO1 or PO2) is re-offset and the bulk of the other transistor remains the same. In some embodiments, the bulks of both transistors PO1 and PO2 are re-offset. FIG. 3 is a diagram of a circuit 300 illustrating re-offsetting to the bulk of both transistors PO1 and PO2. In this illustration, the bulk of transistor PO1 is re-offset with a first value, e.g., voltage Vrob1, by a sub-circuit 300A, and the bulk of transistor PO2 is re-offset with a second value, e.g., voltage Vrob2, by a sub-circuit 300B. Circuits 300A and 300B include similar components and operate in the same manner except circuit 300A is used to re-offset the bulk of transistor PO1 while circuit 300B is used re-offset the bulk of transistor PO2. Further, a circuit 300A or 300B operates substantially the same as circuit 200. For simplicity, only one circuit, e.g., circuit 300A is described, and the operation of the other circuit, e.g., circuit 300B, can be understood by a person of ordinary skill in the art. When there is no compensation or re-offset, signal SET1 is activated, transistor PPG1 is turned on and voltage Vdd is passed to the bulk of transistor PO1. But when a re-offset value, e.g., voltage Vrob1 is desired, signal RESET1 is activated, transistor PPG2 is activated, and voltage Vdd+Vrob1 is passed to the bulk of transistor PO1. In effect, the bulk of transistor PO1 is re-offset with voltage Vrob1.

In circuit 300, voltage Vrob1 or voltage Vrob2 is negative or positive, and the total re-offset by voltage Vrob1 to the bulk of transistor PO1 and voltage Vrob2 to the bulk of transistor PO2 is to reduce the effect of the mismatch between transistor N1 and N2.

Exemplary Method of Re-Offsetting a Plurality of Sense Amplifiers

Figure 4:
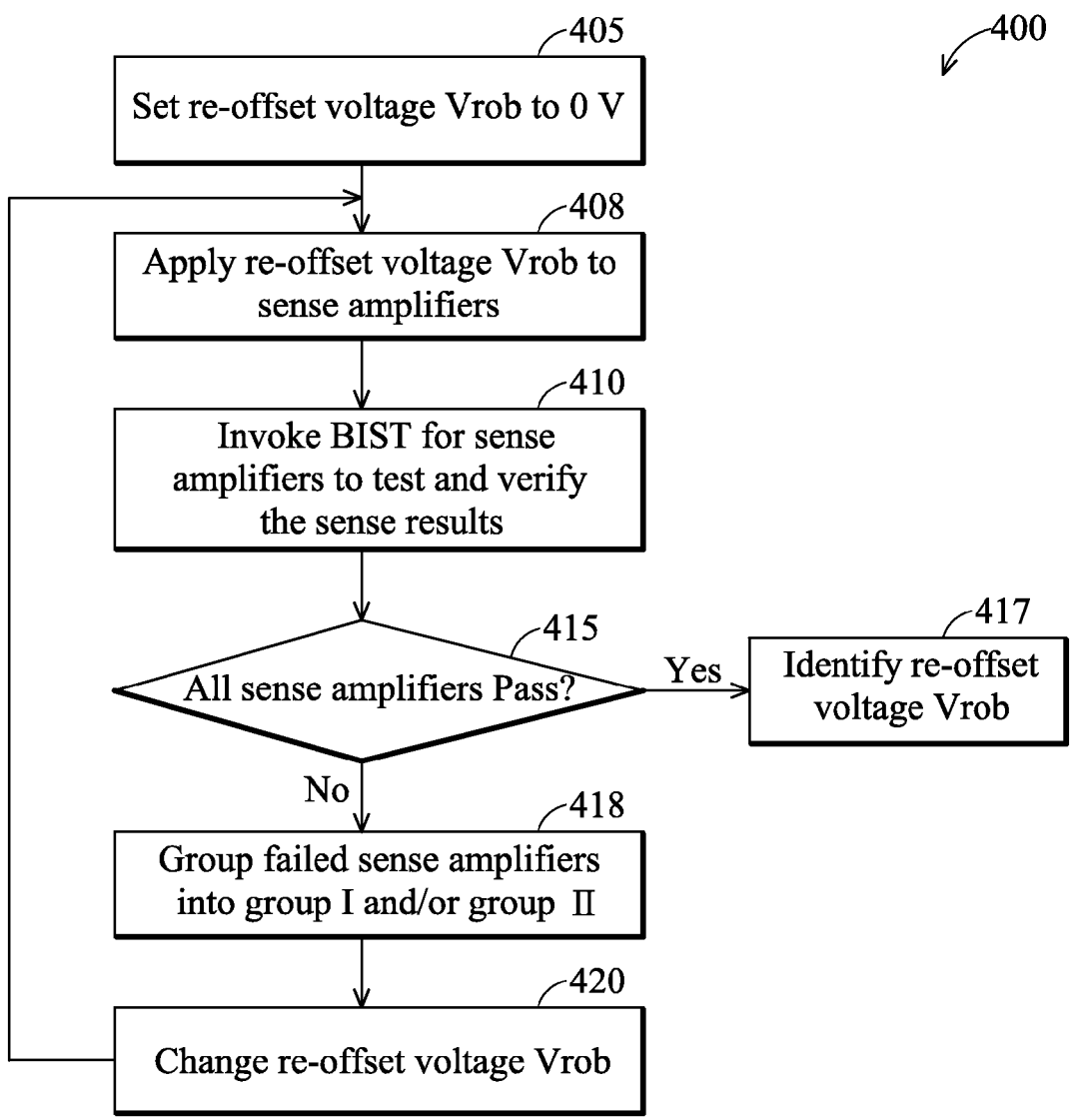
FIG. 4 is a flow chart illustrating a method of compensating the offset for a plurality of the sense amplifiers used in a memory, in accordance with some embodiments.

FIG. 4 is a flowchart illustrating a method 400 of re-offsetting a plurality of sense amplifiers used in a memory array, in accordance with some embodiments. Method 400, however, can be used for sense amplifiers in other circuits.

In step 405, re-offset voltage Vrob is set to 0 V.

In step 408, re-offset voltage Vrob is applied to all sense amplifiers.

In step 410, a BIST is invoked for the sense amplifiers to sense and verify the sense results of the sense amplifiers.

In step 415, if all sense amplifiers pass, the applied voltage Vrob is identified as the desired re-offset voltage in step 417. If, however, any of the amplifiers fails, the failed amplifiers are grouped into a first group favoring reading a High (e.g., group I) and/or a second group favoring reading a Low (e.g., group II) in step 418.

In step 420, re-offset voltage Vrob is changed (e.g., is decreased, for example, by −100 mV, in some embodiments), and the new re-offset voltage (e.g., voltage Vrobn) is applied in step 410, in accordance with the identified groups. For example, for amplifiers in group I, voltage Vrobn is applied to the bulk of transistor PO1 while, for amplifiers in group II, voltage Vrobn is applied to the bulk of transistors PO2. When all amplifiers pass (e.g., in step 415), a first re-offset voltage (e.g., voltage Vrob1) is identified for group I, and a second re-offset voltage (e.g., voltage VrobII) is identified for group II, in step 417.

In flow chart 400, a sequential search (e.g., voltage Vrobn keeps decreasing) is used for illustration. However, other searches, including a binary search are within the scope of various embodiments.

Exemplary Sense Amplifier with Compensation Mechanisms—Some Further Embodiments

Figure 5:
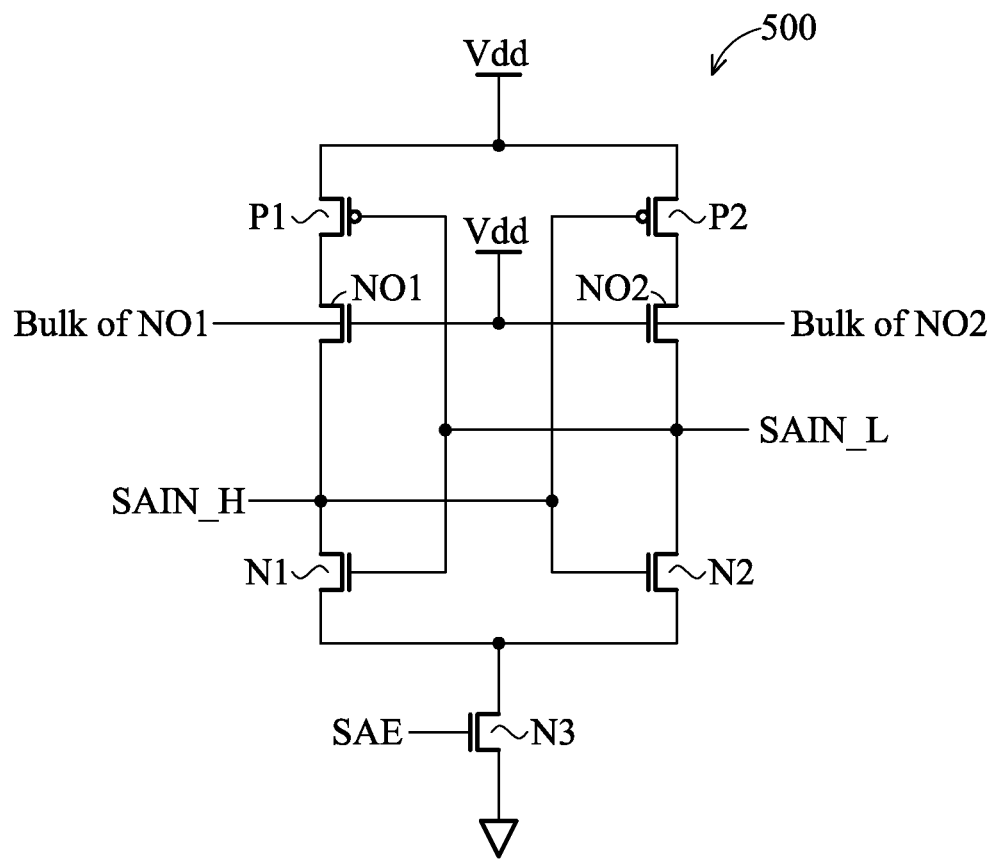
FIG. 5 is a diagram of a sense amplifier having compensation circuitry, in accordance with some further embodiments.

FIG. 5 is a diagram of a sense amplifier (SA) 500 having offset compensation circuitry, in accordance with some further embodiments. Compared with SA 100, SA 500 includes two NMOS transistors NO1 and NO2 that replace PMOS transistors PO1 and PO2, respectively. The gates of transistors NO1 and NO2, however, are coupled to voltage Vdd (e.g., a High) plus Vthn, the threshold voltage of transistors NO1 and NO2, so that transistors NO1 and NO2 are turned on for re-offsetting. Further, the drains of transistors NO1 and NO2 are coupled to the drains of transistors P1 and P2, respectively, and the source of transistors NO1 and NO2 are coupled to the drains of transistor N1 and N2, respectively.

The re-offset operation of transistors NO1 and NO2 is substantially the same as that of transistors PO1 and PO2. For example, when voltage Vthn1 is greater than voltage Vthn2 (e.g., voltage ΔVth is positive), a corresponding positive re-offset voltage Vrob is applied at the bulk of transistor NO2, and when voltage Vthn1 is less than voltage Vthn2 (e.g., voltage ΔVth is negative), a corresponding positive re-offset voltage Vrob is applied at the bulk of transistor NO1, etc. Different techniques (e.g., having one or two re-offset voltages, negative and/or positive re-offset voltages, etc.) applicable to SA 100 are applicable to SA 500 as would be recognizable by a person of ordinary skill in the art.

FIG. 5 is illustrated with the transistor NO1 coupled between transistors P1 and N1, and transistor NO2 coupled between transistors P2 and N2. Various embodiments are not so limited. Transistor NO1 can be coupled between transistor N1 and transistor N3 while transistor NO2 can be coupled between transistor N2 and transistor N3. The sign of re-offset voltage Vrob, however, is changed accordingly, as recognizable by persons of ordinary skilled in the art. For example, when voltage Vthn1 is greater than voltage Vthn2 (e.g., voltage ΔVth is positive), a corresponding negative re-offset voltage Vrob is applied at the bulk of transistor NO2, and when voltage Vthn1 is less than voltage Vthn2 (e.g., voltage ΔVth is negative), a corresponding negative re-offset voltage Vrob is applied at the bulk of transistor NO1, etc.

In the above illustration (e.g., FIG. 1 and FIG. 5), one pair of transistors (e.g., the pair of transistor PO1 and PO2 or the pair of transistor NO1 and NO2) is used. Combinations of pairs of transistors are within the scope of various embodiments, and are recognizable by persons of ordinary skill in the art. For example, a pair of NMOS transistors NO1 and NO2 can be added to circuit 100 by having transistor NO1 coupled between transistor PO1 and transistor N1 or between transistor N1 and transistor N3, and transistor NO2 coupled between transistor PO2 and transistor N2 or between transistor N2 and transistor N3. Similarly, a pair of PMOS transistors PO1 and PO2 can be added to circuit 500 by having transistor PO1 coupled between transistor P1 and voltage Vdd node and transistor PO2 coupled between transistor P2 and voltage Vdd node, etc.

A number of embodiments have been described. It will nevertheless be understood that various modifications may be made without departing from the spirit and scope of the disclosure. For example, the various transistors being shown as a particular dopant type (e.g., NMOS and PMOS) are for illustration purposes, embodiments of the disclosure are not limited to a particular type, but the dopant type selected for a particular transistor is a design choice and is within the scope of various embodiments. The logic level (e.g., low or high) of the various signals used in the above description is also for illustration purposes, various embodiments are not limited to a particular level when a signal is activated and/or deactivated, but, rather, selecting such a level is a matter of design choice. In some embodiments, a source/drain is used for either a source or a drain of a transistor.

Some embodiments are described as having one bulk voltage re-offset applied at a bulk of one transistor PO1 or PO2, and some embodiments are described as having two bulk re-offset voltages applied at the bulks of both transistors PO1 and PO2. Various embodiments of the invention are not limited to a particular mechanism of re-offsetting by using one or two bulk re-offset voltages. Selecting one or two re-offset voltages is a design choice and is within the scope of the various embodiments. In various embodiments, when a re-offset is applied, the re-offset value is either positive or negative and can be applied to a corresponding transistor. For example, in the above illustration, when voltage Vthn1 is greater than voltage Vthn2, a negative re-offset voltage Vrob is applied to the bulk of transistor PO2. Alternatively, a positive re-offset of the same value can be applied to the bulk of transistor PO1. Various embodiments are not limited to a positive or a negative value, nor applying to one particular transistor. For example, when a bulk re-offset voltage corresponding to voltage ΔVth is identified, the re-offset voltage can be applied to a particular transistor, or the same negative offset can be applied to the other transistor, or the bulk re-offset can be split into two and applied to both transistors. For example, the bulk re-offset is Vrob identified, from which ½ Vrob can be applied to the bulk of a transistor (e.g., transistor PO1) and −½ Vrob can be applied to the bulk of the other transistor (e.g., transistor PO2), etc.

Some embodiments regard an amplifier that comprises a first PMOS transistor having a first PMOS drain, a first PMOS gate, and a first PMOS source; a second PMOS transistor having a second PMOS drain, a second PMOS gate, and a second PMOS source; a first NMOS transistor having a first NMOS drain, a first NMOS gate, and a first NMOS source; a second NMOS transistor having a second NMOS drain, a second NMOS gate, and a second NMOS source; a first compensation transistor having a first compensation drain, a first compensation gate, a first compensation source, and a first compensation bulk; a second compensation having a second compensation drain, a second compensation gate, a second compensation source, and a second compensation bulk. The first compensation transistor is coupled to the first PMOS drain and the first NMOS drain. The second compensation transistor is coupled to the second PMOS drain and the second NMOS drain. The second PMOS gate, the second NMOS gate, and the first NMOS drain are coupled together, and serve as a first data input for the sense amplifier. The first PMOS gate, the first NMOS gate, and the second NMOS drain are coupled together, and serve as a second data input for the sense amplifier. The first compensation transistor bulk serves as a first compensation input for the sense amplifier and the second compensation transistor bulk serves as a second compensation input for the sense amplifier.

Some embodiments regard a method of compensating a sense amplifier. The method includes the following steps: determining whether there is a mismatch between a first transistor N1 of the amplifier and a second transistor N2 of the amplifier; and applying a compensation voltage value to one or a combination of a first bulk of a first compensation transistor PO1 of the amplifier and a second bulk of a second compensation transistor PO2 of the amplifier, if there is the mismatch and while the first compensation transistor and the second compensation transistor are on. The first compensation transistor PO1 is coupled between the first transistor N1 and a third transistor P1 of the amplifier. The second compensation transistor PO2 is coupled between the second transistor N2 and a fourth transistor P2 of the amplifier. A gate of the second transistor and a gate of the fourth transistor are coupled together and form a first data input for the amplifier. A gate of the third transistor and a gate of the first transistor are coupled together and form a second data input for the amplifier. Applying the compensation voltage value causes a reduction in a voltage difference between a first threshold voltage of the first transistor and a second threshold voltage of the second transistor.

Some embodiments regard a method of re-offsetting a plurality of amplifier. The method includes testing the plurality of amplifiers based on a re-offset value at bulks of compensation transistors of the plurality of amplifiers; identifying a first group of first amplifiers of the plurality of amplifiers favoring reading a first logic level and/or a second group of second amplifiers of the plurality of amplifiers favoring reading a second logic level different from the first logic level, based on results of the testing step; changing the re-offset value to a new re-offset value; re-offsetting the first group of first amplifiers and/or the second group of second amplifiers based on the new re-offset value; and re-testing the first group of first amplifiers and the second group of second amplifiers.

Some embodiments regard a method of re-offsetting a plurality of amplifiers. The method includes selecting a re-offset voltage equal to an initial value and supplying the re-offset voltage at a bulk of a compensation transistor of each of the plurality of amplifiers. The method further includes determining whether results from each of the plurality of amplifiers matches expected test data using a built-in self-test (BIST) circuit. The method further includes identifying a first group of first amplifiers of the plurality of amplifiers favoring reading a first logic level and/or a second group of second amplifiers of the plurality of amplifiers favoring reading a second logic level different from the first logic level, based on results of the testing step. The method further includes changing the re-offset voltage to a different value and applying the different re-offset voltage to the bulk of the compensation transistor of each of the plurality of amplifiers. The method further includes identifying a desired re-offset voltage if the results from each of the plurality of amplifiers match the expected test results.

Some embodiments regard a method of re-offsetting a plurality of amplifiers. The method includes setting a re-offset voltage to an initial value and testing each of the plurality of amplifiers by applying the re-offset voltage to each of the plurality of amplifiers. The method further includes determining whether results detected from each of the plurality of amplifiers match expected test data. The method further includes classifying each of the plurality of transistors into a first group of transistors favoring reading a high logic value and a second group of transistors favoring reading a low logic value. The method further includes adjusting the re-offset value to a different value and re-testing each of the plurality of amplifiers to determine by applying the re-offset voltage to each of the plurality of amplifiers. The method further includes repeating the determining, classifying, adjusting and re-testing steps until the results detected from each of the plurality of amplifiers matches the expected test data.

The above methods show exemplary steps, but they are not necessarily performed in the order shown. Steps may be added, replaced, changed order, and/or eliminated as appropriate, in accordance with the spirit and scope of disclosed embodiments.

What is claimed is:

1. A method of re-offsetting a plurality of amplifiers, comprising:
   testing the plurality of amplifiers based on a re-offset value at bulks of compensation transistors of the plurality of amplifiers, wherein testing of each amplifier of the plurality of amplifiers comprises assessing an ability of the amplifier to read a signal at a pair of inputs, the signal representing a first logic level and a second logic level different from the first logic level;
   identifying a first group of first amplifiers of the plurality of amplifiers favoring reading the first logic level and/or a second group of second amplifiers of the plurality of amplifiers favoring reading the second logic level, based on results of the testing operation;
   changing the re-offset value to a new re-offset value;
   re-offsetting the first group of first amplifiers and/or the second group of second amplifiers based on the new re-offset value; and
   re-testing the first group of first amplifiers and the second group of second amplifiers.

2. The method of claim 1, wherein:
   re-offsetting the first group of first amplifiers includes, for each first amplifier in the first group of first amplifiers, changing at least one first voltage value at at least one first bulk of at least one first compensation transistor of the each first amplifier; and
   re-offsetting the second group of second amplifiers includes, for each second amplifier in the second group of second amplifiers, changing at least one second voltage value at at least one second bulk of at least one second compensation transistor of the each second amplifier.

3. The method of claim 1, wherein:
   identifying the first group of first amplifiers includes providing first data to the first amplifiers and identifying the first amplifiers that fail;
   identifying the second group of second amplifiers includes providing second data to the second amplifiers and identifying the second amplifiers that fail; and
   the first data is of opposite logic level from the second data.

4. The method of claim 1, wherein a pair of compensation transistors of the compensation transistors is coupled to a pair of transistors of an amplifier of the plurality of amplifiers that has different threshold voltage values.

5. The method of claim 4, wherein the pair of transistors of an amplifier of the plurality of amplifiers that has different threshold voltage values is NMOS transistors and the pair of compensation transistors is NMOS or PMOS transistors.

6. A method of re-offsetting a plurality of amplifiers, the method comprising:
   applying a first voltage to a bulk of a compensation transistor of each amplifier of the plurality of amplifiers;
   assessing an ability of each amplifier of the plurality of amplifiers to read a signal at a pair of inputs, the signal representing a first logic level and a second logic level different from the first logic level;
   identifying a first group of amplifiers of the plurality of amplifiers favoring reading the first logic level after the applying the first voltage; and
   applying a second voltage, different from the first voltage, to the bulk of the compensation transistor of each amplifier of the first group of amplifiers.

7. The method of claim 6, wherein each amplifier of the plurality of amplifiers is coupled between a first power supply voltage and a second power supply voltage and the second power supply voltage is lower than the first power supply voltage;
   when the compensation transistors of the plurality of the amplifiers are PMOS transistors, the first voltage is equal to the first power supply voltage; and
   when the compensation transistors of the plurality of the amplifiers are NMOS transistors, the first voltage is equal to the second power supply voltage.

8. The method of claim 6, wherein the identifying the first group of amplifiers comprises using a built-in self-test (BIST) circuit to perform operations comprising
   comparing the results from each amplifier of the plurality of amplifiers with expected data.

9. The method of claim 6, further comprising calculating the first voltage using an equation:

$$V_{TN} = V_{TO} + \gamma(\sqrt{V_{SB} + 2\phi_F} - \sqrt{2\phi_F})$$

where $V_{TN}$ is a threshold voltage of at least one compensation transistor of the compensation transistors of the plurality of amplifiers, $V_{TO}$ is a threshold voltage of the at least one compensation transistor when $V_{SB}$ is zero, $\gamma$ is a body effect parameter, $V_{SB}$ is a voltage difference between a source and the bulk of the at least one compensation transistor, and $2\phi_F$ is a surface potential.

10. The method of claim 6, wherein the applying the second voltage comprises applying the second voltage to a single compensation transistor.

11. The method of claim 6, further comprising:
   identifying a second group of amplifiers, within the first group of amplifiers, favoring reading the first logic level after the applying the second voltage; and applying a third voltage, different from the first voltage and the second voltage, to the bulk of the compensation transistor of each amplifier of the second group of amplifiers.

12. The method of claim 11, wherein the first voltage, the second voltage, and the third voltage are sequentially decreased.

13. The method of claim 11, wherein the first voltage, the second voltage, and the third voltage are sequentially increased.

14. A method of re-offsetting a group of amplifiers, the method comprising:
   setting a re-offset voltage;
   applying the re-offset voltage to the group of amplifiers;
   assessing an ability of each amplifier of the group of amplifiers to read a signal at a pair of inputs, the signal representing a first logic level and a second logic level different from the first logic level;
   identifying a sub-group of amplifiers, within the group of amplifiers, favoring reading the first logic value; and
   repeating the setting, applying, assessing, and identifying operations to the sub-group until results detected from all amplifiers of the group of amplifiers match expected data.

15. The method of claim 14, wherein the identifying the sub-group comprises:
   applying the re-offset voltage to compensation transistors of the group of amplifiers.

16. The method of claim 14, wherein the identifying the sub-group comprises testing each amplifier of the group of amplifiers using a built-in self-test (BIST) circuit.

17. The method of claim 14, wherein the identifying the sub-group comprises applying the re-offset voltage to a bulk of a compensation transistor of the group of amplifiers.

18. The method of claim 14, wherein the setting the re-offset voltage comprises sequentially decreasing or sequentially increasing the re-offset voltage.

19. The method of claim 18, further comprising setting the re-offset voltage as a desired re-offset voltage for a compensation transistor of an amplifier of the group of amplifiers if the results match the expected data.

20. The method of claim 14, wherein the setting the re-offset voltage comprises setting the re-offset voltage using a binary search technique.

* * * * *